United States Patent [19]

Haase

[11] Patent Number: 4,739,271

[45] Date of Patent: Apr. 19, 1988

[54] DECOUPLING MULTIPLE-COIL NMR PROBES

[75] Inventor: Axel Haase, Goettingen, Fed. Rep. of Germany

[73] Assignee: Max-Planck-Gesellschaft, Fed. Rep. of Germany

[21] Appl. No.: 757,073

[22] Filed: Jul. 19, 1985

[30] Foreign Application Priority Data

Jul. 26, 1984 [DE] Fed. Rep. of Germany ....... 3427666

[51] Int. Cl.⁴ ............................................. G01R 33/20
[52] U.S. Cl. ..................... 324/322; 324/318
[58] Field of Search ............... 324/318, 307, 311, 322, 324/300, 309; 128/653; 335/299

[56] References Cited

U.S. PATENT DOCUMENTS

| | | | |
|---|---|---|---|
| 4,052,661 | 10/1977 | Higham et al. | 324/322 |
| 4,093,911 | 6/1978 | Hill et al. | 324/322 |
| 4,129,822 | 12/1978 | Traficarte | 324/322 |
| 4,408,162 | 10/1983 | Egger | 324/311 |
| 4,620,155 | 10/1986 | Edelstein | 324/322 |
| 4,680,549 | 7/1987 | Tarttu | 324/318 |

FOREIGN PATENT DOCUMENTS 0655029 1/1963 Canada .................................. 324/311

OTHER PUBLICATIONS

E. Boskamp, Application of Surface Coils in MR Imaging, Medicamundi, vol. 29, No. 2, 1984, p. 76.
K. Kisman et al., Coupling Scheme and Probe Damper for Pulsed Nuclear Magnetic Resonance Single Coil Probe, Rev. Sci. Instrum., vol. 45, No. 9, Sep. 74.
M. Moores et al., VHF Pulsed Magnetic Resonance Duplexers, Rev. Sci. Instrum., vol. 42, No. 9, Sep. 71.
J. L. Engle, Broadband Transmit/Receive Circuit for NMR, Rev. Sci. Instrum., vol. 49, No. 9, Sep. 78.
M. A. Packard, Rev. Sci. Instr., 19, 435 (1948).
A. Haase et al., J. Magn. Res., 56, 401 (1984).
C. -N. Chen et al., J. Magn. Res., 54, 324-327 (1983).
R. J. Blume, Rev. Sci. Instr., 33, 1472 (1962).
R. R. Lembo et al., J. Phys. E (Sci. Instr.), 8, 632 (1975).
M. R. Bendall, Chem. Phys. Lett., 99, 310 (1983).
J. L. Lowe et al., J. Sci. Instr. (J. Phys. E) 1, 320 (1968).
Hoult, "Progress in NMR-Spectroscopy", 1978, vol. 12, 41-77.
Eiichi Fukushima, Stephen B. W. Roeder, Experimental Pulse NMR, Reading 1981, Addison-Wesley Publishing Company, Inc., pp. 373-375 and 388-416.
Zeitschrift für Angewandte Physik, Bd., 23, Heft 5, 1967, pp. 341-343.
Publication relating to the invention, A. Haase, J. Magn. Res., 61, 130-136 (1985).

Primary Examiner—Stewart J. Levy
Assistant Examiner—Scott M. Oldham

[57] ABSTRACT

A circuit arrangement is described for preventing a reaction of a coil on an external high-frequency field of predetermined frequency containing the coil due to a current induced by the field in the coil for a multiple-coil probe of a nuclear magnetic resonance apparatus wherein the coil is coupled via a high-frequency line of predetermined characteristic impedance to a switching element and a circuit unit cooperating with the coil. The electrical length of the high-frequency line between the coil and the switching element is so dimensioned that any undesired reaction of an inactive coil on the other coil(s) is eliminated.

6 Claims, 2 Drawing Sheets

DECOUPLING MULTIPLE-COIL NMR PROBES

The invention relates to nuclear magnetic resonance (NMR) apparatus, more specifically to decoupling of multiple-coil NMR probes.

BACKGROUND OF THE INVENTION

Imaging apparatuses utilizing the effect of nuclear magnetic resonance (NMR), such as NMR tomographs, include a magnetic system for generating a static magnetic field ($B_0$ field) which serves to align the nuclear spin and generally has a predetermined gradient structure, and a coil arrangement for generating a spatially homogeneous high-frequency field ($B_1$ field) which extends generally perpendicular to the static magnetic field and which permits tilting of the spin vectors aligned by the $B_0$ field by a predetermined angle or flipping of the spins and serves to detect a high-frequency generated thereby and radiated by the sample.

The aforementioned coil arrangement serving to transmit and receive may include a single coil. However, to obtain a high local resolution with the aid of NMR apparatuses for three-dimensional imaging, as is known it is advantageous to employ several coils, that is a transmitting coil and at least one receiving coil. The transmitting coil, the so-called "homogeneous coil" is generally energized by an HF pulse and generates in the sample the homogeneous magnetic field $B_1$ for stimulating the nuclear magnetic resonance. With the receiving coil an NMR-signal following the stimulating pulse and induced in the sample is received which is amplified in a preamplifier and passed on to a following signal processing circuit. The receiving coil has smaller dimensions than the transmitting coil and may be constructed as so-called "surface coil" which is arranged as near as possible to the surface of an object to be investigated ("sample") over the region to be measured.

The application of this method is restricted by the presence of the surface coil in the field region of the transmitting coil distorting the HF field of the homogeneous coil particularly in the region to be measured. Conversely, the NMR signals are disturbed by the transmitting coil, although to a lesser extent.

It is known from the publications M. A. Packard, Rev. Sci. Instr. 19, 435 (1948) and A. Haase et al., J. Magn. Res. 56, 401 (1984) to decouple the transmitting and receiving coils from each other by a perpendicular arrangement. However, this step cannot always be employed; thus, it is necessary for example in medical diagnostic uses to be able to arrange the surface coil at any desired angles to the transmitting coil.

It is further known from the publication by C.-N. Chen et al., in J. Magn Res. 54, 324–327 (1983), to inductively decouple the transmitting and receiving coils from each other by metal strips (paddles) arranged therebetween. The metal strips must be disposed in the interior of the probe head and are therefore difficulty accessible. Since however every change of the coil arrangement requires resetting of the metal strips this method is not suitable for practical uses.

In the publications by R. J. Blume in Rev. Sci. Instr. 33, 1472 (1962) and by R. R. Lembo et al., in J. Phys. E. (Sci. Instr.) 8, 632 (1975) circuits are described which compensate the voltages which are induced in the coils due to their coupling and cause the aforementioned field distortions. In this case as well, when the coil arrangement is modified a balancing of the compensation circuits is necessary. In addition, such circuits are complicated and troublesome.

Finally, it is known to prevent the reaction of a coil passive at that time (i.e. not transmitting or receiving) by detuning its resonance circuit and thus reducing its coupling to the HF field of the other coil. In the publication by M. R. Bendall in Chem. Phys. Lett. 99, 310 (1983) it is known in this connection to connect an oppositely parallel-connected diode pair either in series or in parallel to the resonance circuit of the coil to be decoupled in order to detune the coil resonance circuit either at high or at low signal voltage. The coil resonance circuits are however generally made very broadband so that the effectiveness of this step is small.

It is known from the publications by D. I. Hoult in Progr. NMR Spec. 12, 41 (1978) and J. L. Lowe et al., in J. Sci. Instr. (J. Phys. E) 1, 320 (1968) for arrangements having only a single coil serving both as receiving and as transmitting coil to protect the input of a receiving part connected to said coil from the HF transmission pulse by a pair of diodes connected in parallel with opposite poling. The diode pair is connected via a $\lambda/4$ line to a T branch of a connection line between an HF transmitter and the coil, $\lambda$ designating the wavelength corresponding to the operating frequency of the coil. The diode pair short-circuits for the duration of the HF transmission pulse the input of the receiving part and the one end of the $\lambda/4$ line so that at the resonance frequency and in the steady state the branch to the receiving part does not take any current. However, no suggestion can be derived from these publications as to how a coupling between two coils and a reaction of a coil on an external field can be suppressed.

SUMMARY OF THE INVENTION

It is therefore the object of the invention to provide an apparatus which prevents a reaction of a voltage induced in a coil on an external HF field in which said coil is disposed and thus renders harmless a coupling of this coil to a coil generating the HF field.

Briefly, according to an embodiment of the present invention, a circuit arrangement is provided for preventing a reaction of a coil on an external high-frequency field of predetermined frequency containing the coil, due to a current induced by the field in the coil, for a multiple-coil probe of a nuclear magnetic resonance apparatus wherein the coil is coupled via a high-frequency line of predetermined characteristic impedance to a switching element and a circuit unit cooperating with the coil and the switching element can assume a first condition, in which it permits a signal transfer between the circuit unit and the coil and an alternative second condition, in which the switching element prevents a signal transfer between the circuit unit and the coil. The improvement of the invention is that the high-frequency line has between the coil-side end coupled to the coil and the switching-element-side end coupled to the switching element an electrical length $L = m\lambda/4$, $\lambda$ being the wavelength in the high-frequency line corresponding to the predetermined frequency and m an integer such that the impedance which the switching element has in its second condition is transformed at the coil-side end to a high impedance relatively to the characteristic impedance.

The invention eliminates any undesirable reaction of an inactive coil, i.e. a coil which is not transmitting or receiving, on the other coil(s). During the actual experiment the coils are effectively decoupled from each other and no distortions can occur of the field generated by the transmitting coil due to the receiving coil or of the field inducing the signals in the receiving coil due to the transmitting coil.

SHORT DESCRIPTION OF THE DRAWINGS

In the drawings:

FIG. 1 shows a schematic perspective illustration of a two-coil arrangement for an NMR probe, FIG. 2 shows a preferred circuit, partly as block circuit diagram, for a transmitting coil, FIG. 3 shows a preferred circuit, partly as block circuit diagram, for a receiving coil, and FIG. 4 is a circuit diagram of a matching circuit suitable for the circuits according to FIGS. 2 and 3.

DETAILED DESCRIPTION

Figure 1:
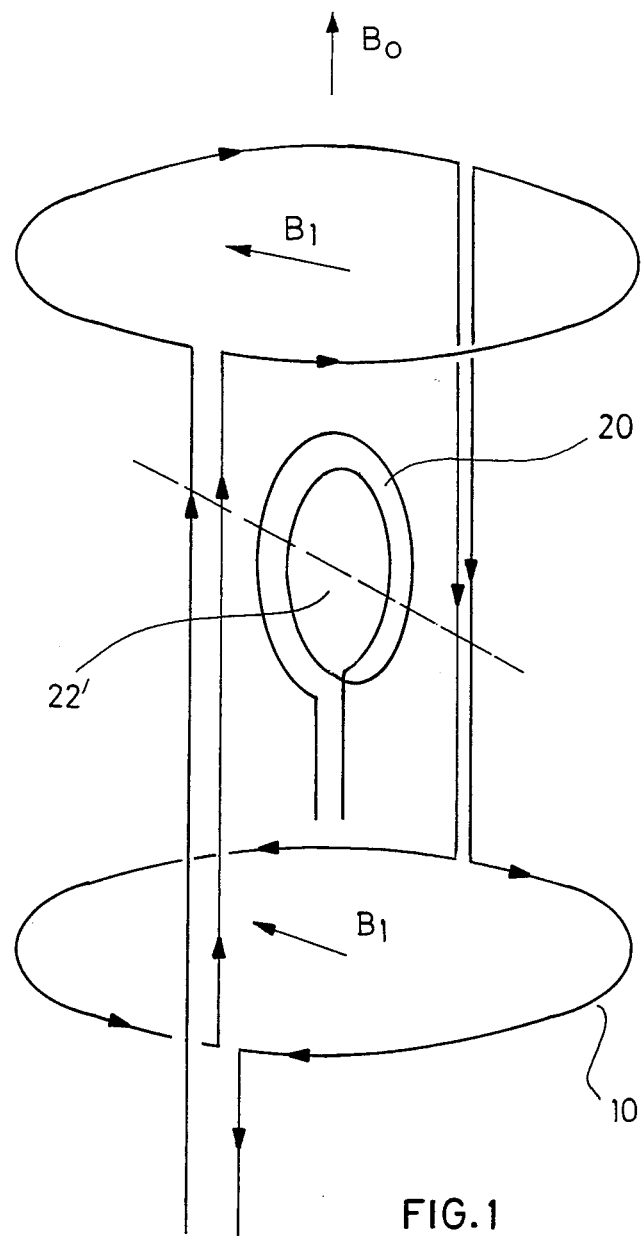

In FIG. 1 a transmitting coil 10 is illustrated which for example can belong to a probe of an NMR apparatus, not shown in detail, is constructed as saddle-shaped coil and encloses a cylindrical region in which a sample (not shown) is disposed. A solenoid-shaped flat planar receiving coil 20 is arranged radially within the transmitting coil in said cylindrical region at any desired orientation, for example substantially coaxial to the transmitting coil. The centre of the receiving region thus extends in the direction of a straight line 22' which is perpendicular to the plane of the receiving coil 20 and in the orientation illustrated extends substantially perpendicularly to the axis of the cylindrical region enclosed by the transmitting coil 10. Of course, in practice the receiving coil may also be aligned with any other area of the sample and have another orientation with respect to the transmitting coil.

In the following description it will be assumed that the arrangement illustrated in FIG. 1 is a two-coil probe of an NMR apparatus, the transmitting coil 10 is coupled to a high-frequency transmitter and the receiving coil 20 is coupled to an amplifier and signal processing part of the apparatus.

In the position shown in FIG. 1 the receiving coil 20 is traversed to a particularly high degree by the field generated by the transmitting coil 10. It is therefore particularly important to prevent a current being induced in the transmitting and/or receiving coil by which the field associated with the respective other coil could be distorted, giving rise to inhomogeneities which could falsify the measurement.

Figure 2:
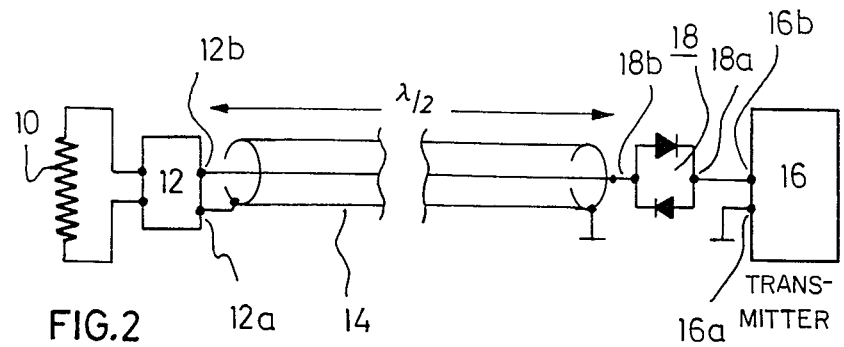

FIG. 2 shows an example of embodiment of the present circuit arrangement with which a reaction by the transmitting coil 10 is prevented. The transmitting coil 10 is connected preferably via a tuning and matching circuit 12 and via a high-frequency line, for example a coaxial cable 14, to a circuit unit associated with the coil, for example a transmitter part 16 of an NMR apparatus, which may be any kind of known transmitter as usual in nuclear magnetic resonance apparatuses, for example NMR spectrometers or NMR tomographs. The transmitter part 16 has terminals 16a and 16b, of which the one terminal 16a is directly connected to the outer conductor of the coaxial cable 14. The other terminal 16b is connected to a terminal 18a of a pair 18 of antiparallel-connected diodes whose other terminal 18b is connected to the inner conductor of the coaxial cable 14.

Between the terminal 18b of the diode pair 18 and the terminal 12b of the matching circuit or, if the latter is not present, the corresponding coil terminal, the coaxial cable 14 has an electrical length of $\lambda/2$ or an integer multiple thereof, $\lambda$ denoting the wavelength in the coaxial cable corresponding here and hereinafter to the operating frequency of the coil.

The diode pair 18 connected effectively in series with the high-frequency line blocks the transmission of signals whose amplitude magnitude is greater than 0.5 volt. Consequently, the HF signals from the transmitter 16 are transmitted unrestricted via the diode pair 18 and the coaxial cable 14 to the coil 10. In contrast, weak signals which are induced whilst the transmitter is not emitting any HF signal of high amplitude, for example in the coil 10 by an external HF field originating from the sample, and reach the diode pair 18 via the coaxial cable meet a very high impedance, i.e. an impedance which is large compared with the characteristic impedance of the high-frequency line. Since the coaxial cable 14 is a $\lambda/2$ line it transforms the very high impedance of the blocking diode pair at the terminal 18b to an equally high impedance at the terminal 12b at the other end of the coaxial cable 14. The coil 10 with the tuning and matching circuit 12 thus cannot supply to the coaxial cable any current which is induced by the external field and by which a reaction on the external field might be caused. This transmitting coil 10 is therefore effectively decoupled from the receiving coil 20 (FIG. 1).

Figure 3:
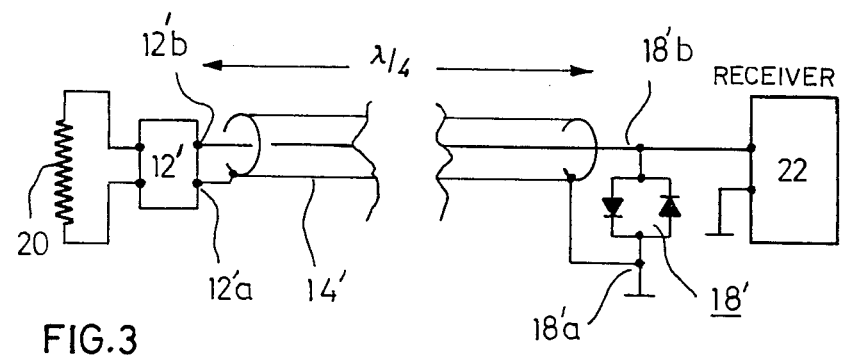

As FIG. 3 shows the receiving coil 20 can be coupled via a tuning and matching circuit 12' having output terminals 12'a and 12'b to the one end of a high-frequency line, for example a coaxial cable 14'. The other end of the coaxial cable 14' is connected with the terminals 18'a, 18'b of a pair 18' of anti-parallel-connected diodes and to a receiving part 22 of the NMR apparatus.

In this case the electrical length of the coaxial cable 14' between the terminals 12'b and 18'b is equal to $\lambda/4$ or an odd multiple thereof, i.e. $(2n+1)\lambda/4$, n denoting an integer including zero, and the diode pair 18' is connected in parallel with the end of the coaxial line 14' remote from the coil 20. Between the diode pair 18' and the input of the receiving part 22 a high-frequency line may also be provided whose length is not subjected to any specific requirements if it is not to perform any matching function.

For signals whose amplitude magnitude is less than 0.5 volt the diode pair 18' connected in parallel with the receiver-side end of the coaxial cable represents a very high impedance and consequently these signals are transmitted practically unattenuated to the receiving part 22. However, if during transmission the signal amplitude exceeds this value the diode pair short-circuits the end of the coaxial cable remote from the coil. Since the coaxial cable is effectively a $\lambda/4$ line it transforms the now very low impedance between the terminals 18'a and 18'b for signals of a frequency corresponding to the wavelength $\lambda$ to a very high impedance at the terminals 12'a and 12'b of the tuning and matching circuit 12' (or at the terminals the coil if no tuning and matching circuit is present). It is then practically not possible for any current by which an interference field might be generated to flow from the receiving coil 20 into the coaxial cable. Thus, the receiving coil is also reaction-free and decoupled from the transmitting coil as long as the diode pair 18' short-circuits the coaxial cable 14' at the receiver-side end.

Figure 4:
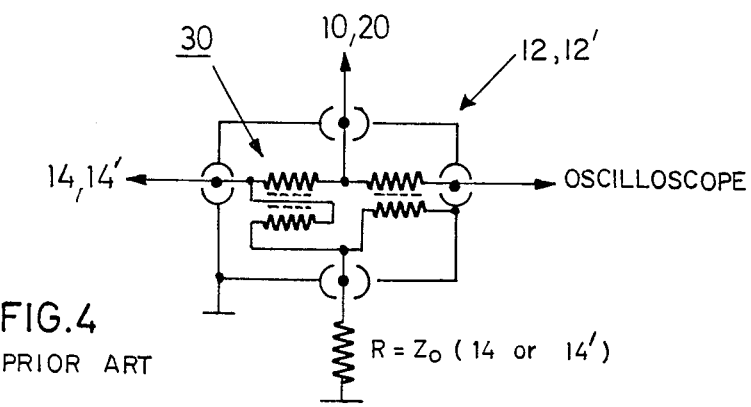

A preferred embodiment of the matching circuit is illustrated in FIG. 4. This matching circuit is known from FIG. 57 on page 72 of the publication by Hoult in "Progress in NMR-Spectroscopy", 1978, volume 12, pages 41 to 47. The matching circuit includes, in so far as it is of interest for matching the coil to the coaxial cable, a transformer 30 having two windings each of three or more convolutions on a ferrite bead. Since such matching circuits are known any further description would be superfluous. Of course, other matching circuits may also be used. The effective electrical path length in the tuning and matching circuit, i.e. between its input and output terminals, should however be small compared with the wavelength λ corresponding to the operating frequency. Furthermore, the matching circuit should form with the coil or on its own no resonance circuit in which at the operating frequencies currents can occur which cause a field distortion even without flowing to the high-frequency line.

The high-frequency line in the examples of the embodiment described which consists of a coaxial cable and is tuned in length to the operating frequency represents an impedance transformer whose one terminal pair is connected to a passive switching element consisting in the examples of embodiment illustrated of a pair of antiparallel diodes and whose other terminal pair is connected possibly via a matching circuit to the coil to be rendered reaction-free, for example of a multiple-coil NMR probe. If the coil is inactive the switching element has a condition such that at the coil-side end of the impedance transformer there is a very high (theoretically infinitely high) impedance which prevents currents which could lead to an undesired reaction from flowing in the coil.

Instead of the antiparallel diodes described other switching elements may be used which are also active, i.e. may be controllable by an inherent control parameter, for example thyristors and other semiconductor switching means, possibly even mechanical switches.

When using the present invention the transmission coil and the receiving coil can both be tuned to the operating frequency corresponding to the wavelength λ. Thus, detuning for decoupling is not necessary and nor is any specific orientation of the coils with respect to each other.

What is claimed is:

1. A nuclear magnetic resonance apparatus having
   a transmitting coil (10) for generating in a sample a high-frequency magnetic field of a predetermined frequency;
   a separate receiving coil (20) adapted to receive from said sample a signal resulting from response to said magnetic field;
   said transmitting and receiving coils not being simultaneously active;
   a transmitter (16) coupled to the transmitting coil (10);
   a receiver (22) coupled to the receiving coil (20);
   a pair of high-frequency lines (14, 14') of characteristic impedance, each coupling one of said transmitter and receiver to its respective coil (10, 20);
   wherein, in accordance with the invention,
   a pair of switching elements (18, 18') is provided, each connected to one of said high-frequency line (14, 14') at a point thereof remote from said respective coil; and
   the electrical length of each high-frequency line between the respective coil and the switching element is selected to be an integer multiple of one quarter of a wavelength, in said high-frequency line, corresponding to said predetermined frequency, such that, when the respective coil is inactive, the end of the high-frequency line connected to the respective coil presents a high impedance to the coil, essentially preventing the flow on induced current in said inactive coil.

2. A nuclear magnetic resonance apparatus as claimed in claim 1, wherein said voltage-responsive switching unit (18') comprises a pair of anti-parallel-connected diodes.

3. A nuclear magnetic resonance apparatus having
   a transmitting coil (10) for generating in a sample a high-frequency magnetic field of a predetermined frequency;
   a separate receiving coil (20) adapted, when active, to receive from said sample a relatively weak signal resulting from response to said magnetic field;
   said transmitting and receiving coils not being simultaneously active;
   a transmitter (16) coupled to the transmitting coil (10);
   a receiver (22) coupled to the receiving coil (20); a first high-frequency line (14) of characteristic impedance, coupling said transmitter (16) and said transmitting coil (10); a second high-frequency line (14') of characteristic impedance, coupling said receiver (22) to said receiving coil (20);
   wherein (FIG. 2), in accordance with the invention,
   a voltage-responsive switching unit (18) is provided, connected in series in said first high-frequency line (14) which couples said transmitter (16) and said transmitting coil (10);
   the electrical length of said high-frequency line (14) between said transmitting coil (10) and said serially-connected voltage-responsive switching unit (18) being an integer multiple of one half of a wavelength, in said high-frequency line, corresponding to said predetermined frequency; and
   said voltage-responsive switching unit (18) and, thus, the coil end of said high-frequency line (14) coupled to said transmitting coil (10), presenting a high impedance to weak signals when said transmitter (16) and transmitting coil (10) are inactive, and said receiving coil (20) is active, thereby preventing current flow due to a voltage induced in said inactive transmitting coil (10) by the active receiving coil (20).

4. A nuclear magnetic resonance apparatus as claimed in claim 3, wherein said voltage-responsive switching unit (18') comprises a pair of anti-parallel-connected diodes.

5. A nuclear magnetic resonance apparatus having
   a transmitting coil (10) for generating in a sample a high-frequency magnetic field of a predetermined frequency;
   a separate receiving coil (20) adapted, when active, to receive from said sample a relatively weak signal resulting from response to said magnetic field;
   said transmitting and receiving coils not being simultaneously active;
   a transmitter (16) coupled to the transmitting coil (10);
   a receiver (22) coupled to the receiving coil (20); a first high-frequency line (14) of characteristic impedance, coupling said transmitter (16) and said transmitting coil (10); a second high-frequency line (14') of characteristic impedance, coupling said receiver (22) to said receiving coil (20), said second high-frequency line comprising two conductors;

wherein (FIG. 3), in accordance with the invention,
a voltage-responsive switching unit (18') is provided, connected in parallel with two conductors of said second high-frequency line (14'), at a point of said second high-frequency line remote from said receiving coil (20), said voltage-responsive switching unit presenting a high impedance to low amplitude signals generated in said receiving coil (20) in response to said magnetic field and permitting said signals to pass unattenuated from said receiving coil (20) to said receiver (22), while presenting a low impedance to high amplitude signals induced in said receiving coil (20) when said transmitting coil (10) is active;

the electrical length of said second-high frequency line (14') between said receiving coil (20) and said voltage-responsive switching unit (18) being an odd integer multiple of one quarter of a wavelength, in said high-frequency line, corresponding to said predetermined frequency;

said switching unit (18') effectively short-circuiting said second high-frequency line (14') at said point when said transmitting coil (10) is active, to produce a high impedance at the end coupled to said receiving coil (20), whereby flow of current induced by the active transmitting coil (10) in said inactive receiving coil (20) is essentially prevented by said high impedance.

6. A nuclear magnetic resonance apparatus as claimed in claim 5, wherein said voltage-responsive switching unit (18') comprises a pair of anti-parallel-connected diodes.

* * * * *